(12) United States Patent
Li

(10) Patent No.: US 10,115,749 B2
(45) Date of Patent: Oct. 30, 2018

(54) ARRAY SUBSTRATES AND THE MANUFACTURING METHOD THEREOF

(71) Applicant: Wuhan China Star Optoelectronics Technology Co., Ltd., Wuhan, Hubei (CN)

(72) Inventor: Zijian Li, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 172 days.

(21) Appl. No.: 15/109,652

(22) PCT Filed: Jun. 12, 2016

(86) PCT No.: PCT/CN2016/085461
§ 371 (c)(1),
(2) Date: Jul. 4, 2016

(87) PCT Pub. No.: WO2017/197676
PCT Pub. Date: Nov. 23, 2017

(65) Prior Publication Data
US 2018/0151605 A1 May 31, 2018

(30) Foreign Application Priority Data
May 20, 2016 (CN) .......................... 2016 1 0343386

(51) Int. Cl.
*H01L 27/12* (2006.01)
*H01L 21/77* (2017.01)
(Continued)

(52) U.S. Cl.
CPC .... *H01L 27/1288* (2013.01); *H01L 21/31116* (2013.01); *H01L 21/77* (2013.01);
(Continued)

(58) Field of Classification Search
CPC ............... H01L 27/1259; H01L 27/127; H01L 27/1288; H01L 21/707; H01L 29/786–29/78696; H01L 29/401
See application file for complete search history.

(56) References Cited

U.S. PATENT DOCUMENTS 6,545,359 B1 * 4/2003 Ohtani .............. H01L 23/53223
257/758
6,790,716 B2 * 9/2004 Cha ........................ H01L 27/12
257/E27.111
(Continued)

FOREIGN PATENT DOCUMENTS

| CN | 101123257 A | 2/2008 |
| CN | 103293797 A | 9/2013 |
| KR | 1020090058283 A | 6/2009 |

*Primary Examiner* — Scott B Geyer
(74) *Attorney, Agent, or Firm* — Andrew C. Cheng

(57) ABSTRACT

The present disclosure relates to an array substrate and the manufacturing method thereof. The manufacturing method includes depositing a conductive layer on a substrate, forming three poles of at least one thin film transistor (TFT), a first signal line, and a second signal line by etching the conductive layer via a first mask, The method also includes depositing an intermediate layer in sequence, forming a first connecting bridge connecting a first portion and a second portion by etching the intermediate layer via a second mask, depositing a conductive electrode, and forming at least one pixel electrode and a connecting line between the first portion and the second portion by etching the conductive electrode via a third mask. In this way, the time of the manufacturing process of the array substrates may be reduced such that the manufacturing cost may be decreased.

13 Claims, 5 Drawing Sheets

(51) Int. Cl.
*H01L 21/311* (2006.01)
*H01L 29/786* (2006.01)
*G02F 1/1368* (2006.01)

(52) U.S. Cl.
CPC ............ *H01L 27/12* (2013.01); *H01L 27/124* (2013.01); *H01L 27/1255* (2013.01); *H01L 29/78618* (2013.01); *G02F 1/1368* (2013.01)

(56) References Cited

U.S. PATENT DOCUMENTS

| | | | | |
|---|---|---|---|---|
| 7,888,148 | B2* | 2/2011 | Park | C09K 13/08 257/E21.156 |
| 9,025,118 | B2* | 5/2015 | Lee | H01L 27/124 349/139 |
| 9,318,614 | B2* | 4/2016 | Shieh | H01L 29/7869 |
| 2005/0077524 | A1* | 4/2005 | Ahn | G02F 1/13458 257/72 |
| 2016/0118421 | A1* | 4/2016 | Xu | H01L 27/1288 438/586 |
| 2016/0197190 | A1* | 7/2016 | Lee | H01L 29/7869 257/43 |
| 2017/0110323 | A1* | 4/2017 | An | H01L 21/0272 |
| 2017/0207346 | A1 | 7/2017 | Kong et al. | |

* cited by examiner

ARRAY SUBSTRATES AND THE MANUFACTURING METHOD THEREOF

BACKGROUND OF THE INVENTION

1. Field of the Invention

The present disclosure relates to liquid crystal display technology, and more particularly to an array substrate and the manufacturing method thereof.

2. Discussion of the Related Art

Currently, thin film transistor (TFT) liquid crystal displays (LCDs) have been widely adopted. Corresponding voltages of pixel electrodes are usually controlled by TFTs on the array substrate so as to control the alignment of the liquid crystals and to correspondingly display. Regarding conventional manufacturing process of the array substrates, as the structure of the array substrate is complicated, usually, five or four masks have to be adopted to perform the etching process.

However, as the number of the masks involved with the manufacturing process of the array substrates is great, the manufacturing process is long, which increases the manufacturing cost.

SUMMARY

The present disclosure relates to an array substrate and the manufacturing method thereof to enhancing the time-consuming manufacturing process so as to reduce the manufacturing cost.

In one aspect, a manufacturing method of array substrates includes: depositing a conductive layer on a substrate, and forming three poles of at least one thin film transistor (TFT), a first signal line, and a second signal line by etching the conductive layer via a first mask, wherein the first signal line includes a first portion and a second portion respectively at two sides of the second signal line; depositing an intermediate layer in sequence, and forming a first connecting bridge connecting the first portion and the second portion by etching the intermediate layer via a second mask; and depositing a conductive electrode, and forming at least one pixel electrode and a connecting line between the first portion and the second portion by etching the conductive electrode via a third mask.

Wherein the first portion of the first signal line electrically connects to a first pole of the TFT, the second signal line electrically connects to a second pole of the TFT, and the intermediate layer includes an insulation layer, an active layer, an ohmic contact layer, and a passivation layer stacked in sequence; the step of forming a first connecting bridge connecting the first portion and the second portion by etching the intermediate layer via a second mask further includes forming a second connecting bridge connecting the second pole and a third pole of the TFT by etching the intermediate layer via the second mask; the step of forming at least one pixel electrode and a connecting line between the first portion and the second portion by etching the conductive electrode via a third mask further includes disconnecting the conductive electrode, the passivation layer, and the second pole and the third pole corresponding to the ohmic contact layer by etching the second connecting bridge via the third mask.

Wherein the step of forming the second connecting bridge connecting the second pole and the third pole of the TFT by etching the intermediate layer via the second mask further includes: adopting HF to etch edges of the passivation layer and the insulation layer of the second connecting bridge such that the active layer and the ohmic contact layer of the second connecting bridge protrude outward to form at least one contact ring.

Wherein the conductive electrode on the second connecting bridge is arranged on the contact ring such that the conductive electrode electrically connects to the contact ring, the second pole, and the third pole.

Wherein the step of forming the first connecting bridge connecting the first portion and the second portion by etching the intermediate layer via a second mask further includes forming a capacitance isolation structure on the first portion by etching the intermediate layer via the second mask; the step of forming at least one pixel electrode and a connecting line between the first portion and the second portion by etching the conductive electrode via the third mask further includes forming a storage capacitance electrode on the capacitance isolation structure by etching the conductive electrode via the third mask.

Wherein the first pole, the second pole, and the third pole of the TFT are respectively a gate, a source, and a drain, and the first signal line is a signal line, and the second signal line is a data line.

Wherein the first pole, the second pole, and the third pole of the TFT are respectively a gate, a source, and a drain, and the first signal line is a data line, and the second signal line is a signal line.

In another aspect, an array substrate includes: a substrate; three poles of at least one TFT on the substrate, a first signal line, and a second signal line, wherein the first signal line includes a first portion and a second portion respectively at two sides of the second signal line; a first connecting bridge between the first portion and the second portion, wherein the first connecting bridge is isolated from the second signal line; and at least one pixel electrode and a connecting line on the first connecting bridge, and the connecting line electrically connects the first portion and the second portion.

Wherein the first portion of the first signal line electrically connects to the first pole of the TFT; the array substrate further includes a second connecting bridge between the second pole and the third pole of the TFT, a first conductive electrode and a second conductive electrode on the second connecting bridge, the second connecting bridge includes an insulation layer, an active layer, an ohmic contact layer, and a passivation layer, two portions of the passivation layer and the ohmic contact layer of the second connecting bridge separated by the disconnected area are arranged in accordance with the second pole and the third pole, the first conductive electrode electrically connects to the second pole, the active layer, and the second signal line, and the conductive electrode electrically connects to the third pole, the active layer, and the pixel electrode.

Wherein the active layer and the ohmic contact layer of the second connecting bridge protrude outward to form at least one contact ring.

Wherein the conductive electrode on the second connecting bridge is arranged on the contact ring such that the conductive electrode electrically connects to the contact ring, the second pole, and the third pole.

Wherein the array substrate further includes a capacitance isolation structure and a storage capacitance electrode arranged on the first portion in sequence.

Wherein the first pole, the second pole, and the third pole of the TFT are respectively a gate, a source, and a drain, and the first signal line is a signal line, and the second signal line is a data line.

Wherein the first pole, the second pole, and the third pole of the TFT are respectively a gate, a source, and a drain, and the first signal line is a data line, and the second signal line is a signal line.

In another aspect, an array substrate manufactured by a manufacturing method. The method comprising: depositing a conductive layer on a substrate, and forming three poles of at least one thin film transistor (TFT), a first signal line, and a second signal line by etching the conductive layer via a first mask, wherein the first signal line includes a first portion and a second portion respectively at two sides of the second signal line; depositing an intermediate layer in sequence, and forming a first connecting bridge connecting the first portion and the second portion by etching the intermediate layer via a second mask; and depositing a conductive electrode, and forming at least one pixel electrode and a connecting line between the first portion and the second portion by etching the conductive electrode via a third mask.

Wherein the first portion of the first signal line electrically connects to a first pole of the TFT, the second signal line electrically connects to a second pole of the TFT, and the intermediate layer includes an insulation layer, an active layer, an ohmic contact layer, and a passivation layer stacked in sequence; the step of forming a first connecting bridge connecting the first portion and the second portion by etching the intermediate layer via a second mask further includes forming a second connecting bridge connecting the second pole and a third pole of the TFT by etching the intermediate layer via the second mask; the step of forming at least one pixel electrode and a connecting line between the first portion and the second portion by etching the conductive electrode via a third mask further includes disconnecting the conductive electrode, the passivation layer, and the second pole and the third pole corresponding to the ohmic contact layer by etching the second connecting bridge via the third mask.

Wherein the step of forming the second connecting bridge connecting the second pole and the third pole of the TFT by etching the intermediate layer via the second mask further includes: adopting HF to etch edges of the passivation layer and the insulation layer of the second connecting bridge such that the active layer and the ohmic contact layer of the second connecting bridge protrude outward to form at least one contact ring.

Wherein the conductive electrode on the second connecting bridge is arranged on the contact ring such that the conductive electrode electrically connects to the contact ring, the second pole, and the third pole.

Wherein the step of forming the first connecting bridge connecting the first portion and the second portion by etching the intermediate layer via a second mask further includes forming a capacitance isolation structure on the first portion by etching the intermediate layer via the second mask; the step of forming at least one pixel electrode and a connecting line between the first portion and the second portion by etching the conductive electrode via the third mask further includes forming a storage capacitance electrode on the capacitance isolation structure by etching the conductive electrode via the third mask.

Wherein the first pole, the second pole, and the third pole of the TFT are respectively a gate, a source, and a drain, and the first signal line is a signal line, and the second signal line is a data line.

In view of the above, the first signal line of the array substrate includes two sections respectively arranged at two sides of the second signal line. Afterward, the connecting line connecting to the first signal line is formed in the subsequent mask process. In this way, the first signal line may be normally arranged, and the first signal line and the second signal line may be formed by one mask process, and thus two separate mask processes are not needed. Thus, the number of the mask process may be reduced so as to save the manufacturing time and cost.

DETAILED DESCRIPTION OF THE EMBODIMENTS

Embodiments of the invention will now be described more fully hereinafter with reference to the accompanying drawings, in which embodiments of the invention are shown.

Figure 1:
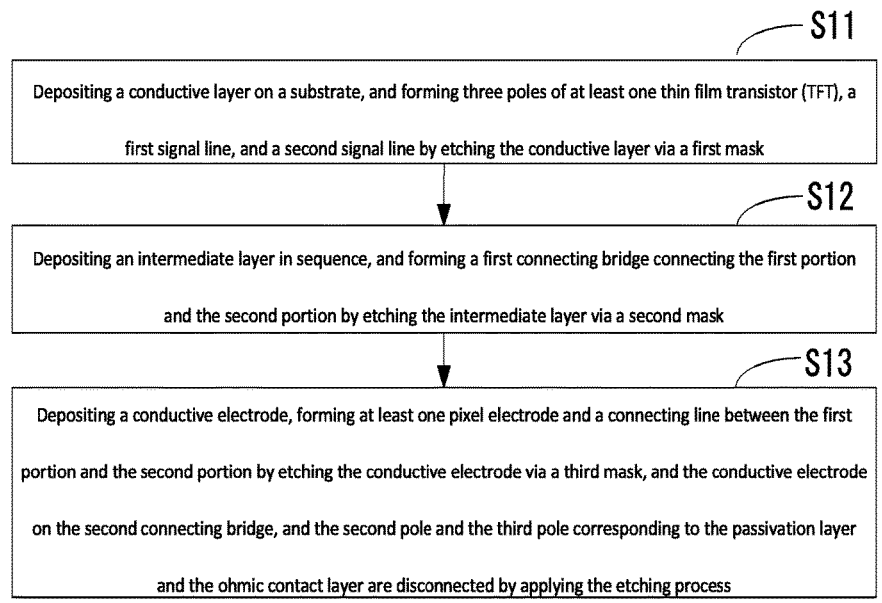
FIG. 1 is a flowchart illustrating a manufacturing method of the array substrate in accordance with one embodiment.

FIG. 1 is a flowchart illustrating a manufacturing method of the array substrate in accordance with one embodiment. The method includes the following steps.

In step S11, depositing a conductive layer on a substrate, and forming three poles of the TFTs, a first signal line, and a second signal line by etching the conductive layer via a first mask.

The substrate may be a glass substrate or a substrate made by other transparent insulation material. The conductive layer may be a metal layer, or may be non-metal materials that are conductive.

Figure 2:
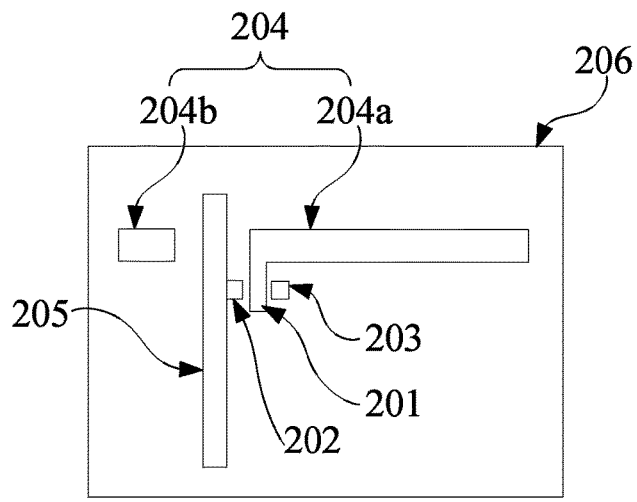
FIG. 2 is a top view showing the array substrate obtained by the step S11 in FIG. 1.

Referring to FIG. 2, the conductive layer may be deposited on the substrate 206 by Physical Vapor Deposition (PVD). In addition, a photo lithography process is applied to the conductive layer via the patterned first mask to define the patterns of the three poles of the TFT, the first signal line, and the second signal line. Afterward, a wetting etching process is applied to form a first pole 201, a second pole 202, a third pole 203, and a first signal line 204, and a second signal line 205.

The first signal line 204 vertically intersects with the second signal line 205. The first signal line 204 includes a first portion 204a and a second portion 204b respectively at two sides of the second signal line 205, and the first portion 204a and the second portion 204b are not electrically connected with the second signal line 205.

In the embodiment, the first portion 204a of the first signal line 204 electrically connects with the first pole 201 of the TFT, and the second signal line 205 electrically connects with the second pole 202 of the TFT.

In step S12, depositing an intermediate layer in sequence, and forming a first connecting bridge, a second connecting bridge, and a capacitance isolation structure by etching the intermediate layer via a second mask.

Figure 3:
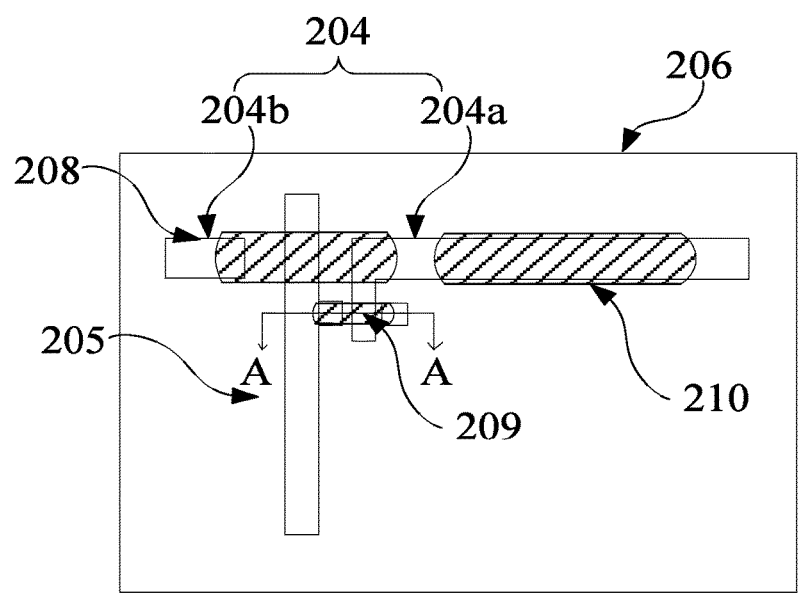
FIG. 3 is a top view showing the array substrate obtained by the step S12 in FIG. 1.

In an example, the intermediate layer 207 includes an insulation layer 207a (also referred to as a gate insulator (GI)), an active layer 207b, an ohmic contact layer 207c, and a passivation layer 207d. Also referring to FIG. 3, adopting the Plasma Enhanced Chemical Vapor Deposition (PECVD) to deposit the insulation layer 207a, the active layer 207b, the ohmic contact layer 207c, and the passivation layer 207d on the substrate in sequence, wherein the active layer 207b may include a-Si and/or p-Si. The ohmic contact layer 207c may be n$^+$ a-Si.

Afterward, the patterned second mask is adopted to perform the photo lithography toward the intermediate layer 207 to define a first connecting bridge 208 and a second connecting bridge 209 on the intermediate layer 207, and to define the patterns on the capacitance isolation structure 210 above the first portion 204a. The first connecting bridge 208 connects the first portion 204a and the second portion 204b, and the second connecting bridge 209 connects the second pole 202 and the third pole 203. The dry etching process is performed on the conductive layer to form the first connecting bridge 208, the second connecting bridge 209 (also called as silicon conduction), and the capacitance isolation structure 210.

Preferably, to ensure the conductive electrode of the top conductive layer is isolated from the conductive electrode of the down conductive layer, the first connecting bridge 208 and capacitance isolation structure 210 completely cover the first signal line along a width direction. In an example, the width of the first connecting bridge 208 is greater than that of the first portion 204a and the second portion 204b of the first signal line, and the width of the capacitance isolation structure 210 is greater than the width of the first portion 204a.

Figure 4:
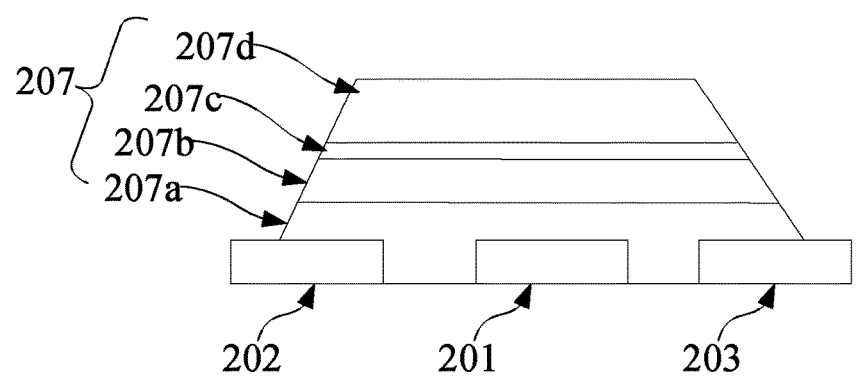
FIG. 4 is a cross sectional view of the array substrate along the AA direction, wherein the contact ring is formed without applying the etching process.
Figure 5:
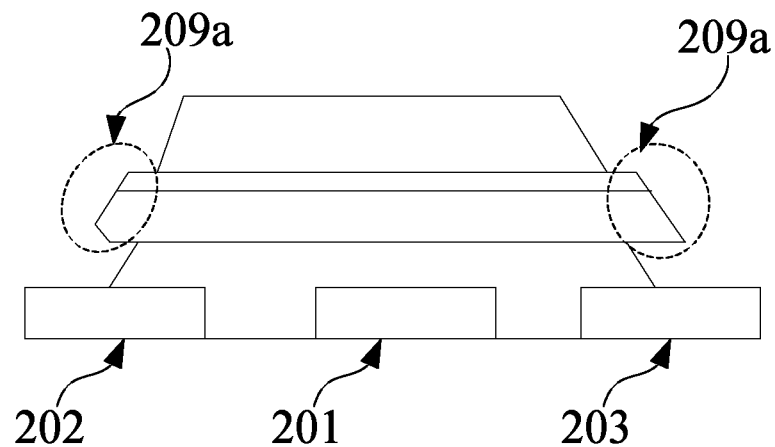
FIG. 5 is a cross sectional view of the array substrate along the AA direction, wherein the contact ring is formed by applying the etching process.

Further, to ensure the active layer and the ohmic contact layer may greatly contact with the down conductive layer and the below conductive electrode, after forming the second connecting bridge 209, the step further includes:

Adopting HF to perform the etching process toward edges of the passivation layer and the insulation layer of the second connecting bridge 209, such that the active layer 207b and the ohmic contact layer 207c of the second connecting bridge 209 protrude outward to form at least one contact ring 209a. FIG. 4 is a cross sectional view of the array substrate along the AA direction, wherein the contact ring is formed without applying the etching process. In an example, the HF is adopted to perform the etching process toward edges of the passivation layer 207d and the insulation layer 207a of the second connecting bridge 209 to maintain the edges of the active layer 207b and the ohmic contact layer 207c of the second connecting bridge 209 to form a semi-circle contact ring (O-ring) 209a. The HF is adopted for the reason that HF has a selectivity toward the Si and SiOx.

It can be understood that, in real applications, after the second connecting bridge is formed, the contact ring is not formed. That is, the active layer and the ohmic contact layer have no protrusions corresponding to the passivation layer and the insulation layer.

In step S13, depositing a conductive electrode, and adopting a third mask to etch the conductive electrode so as to form a pixel electrode, a connecting line, and a storage capacitance electrode. In addition, the conductive electrode on the second connecting bridge, and the second pole and the third pole corresponding to the passivation layer and the ohmic contact layer are disconnected by applying the etching process.

Figure 6:
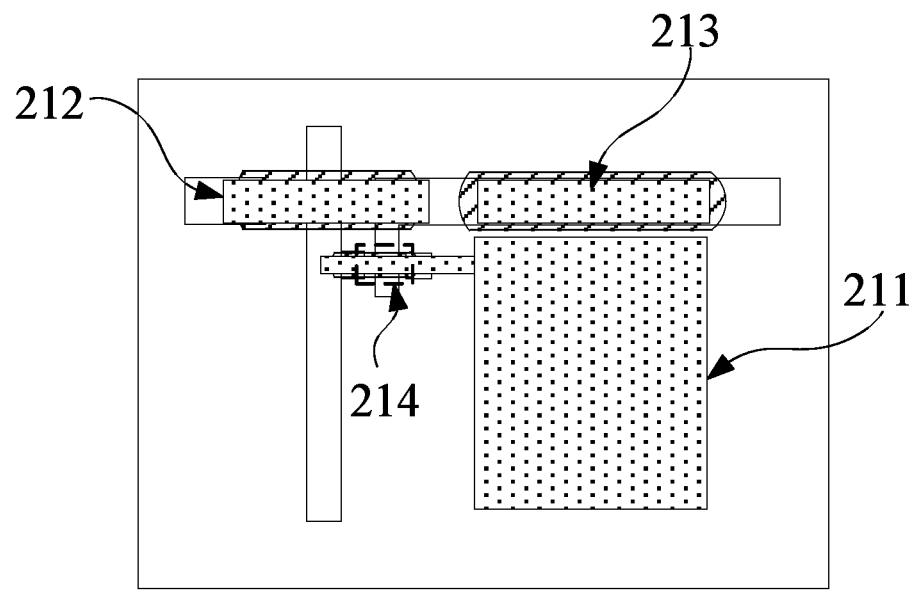
FIG. 6 is a first top view showing the array substrate obtained by the step S13 in FIG. 1.
Figure 7:
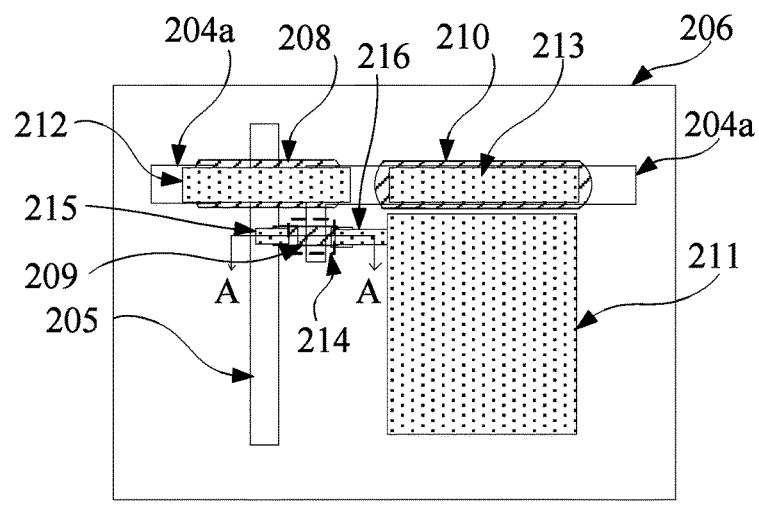
FIG. 7 is a second top view showing the array substrate obtained by the step S13 in FIG. 1.
Figure 8:
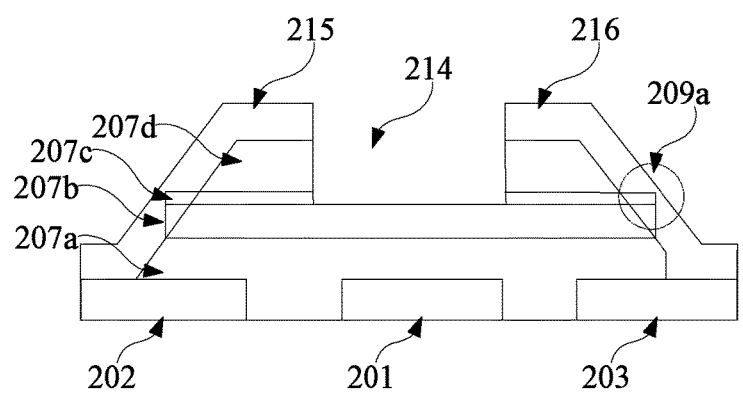
FIG. 8 is a cross sectional view of the array substrate of FIG. 7 along the AA direction in accordance with one embodiment.

In an example, referring to FIGS. 6-8, the PVD process is adopted to deposit the transparent conductive electrode, i.e., Indium tin oxide (ITO). The photo lithography process is applied to the transparent conductive electrode via the patterned third mask to define the pixel electrode 211, the connecting line between the first portion 204a and the second portion 204b, the storage capacitance electrode 213 on the capacitance isolation structure 210, and the disconnected area 214 of the second connecting bridge between the second pole and the third pole. Afterward, the wet etching process is applied to the transparent conductive electrode to form the pixel electrode 211, the connecting line 212, and the storage capacitance electrode 213, as shown in FIG. 6.

Figure 9:
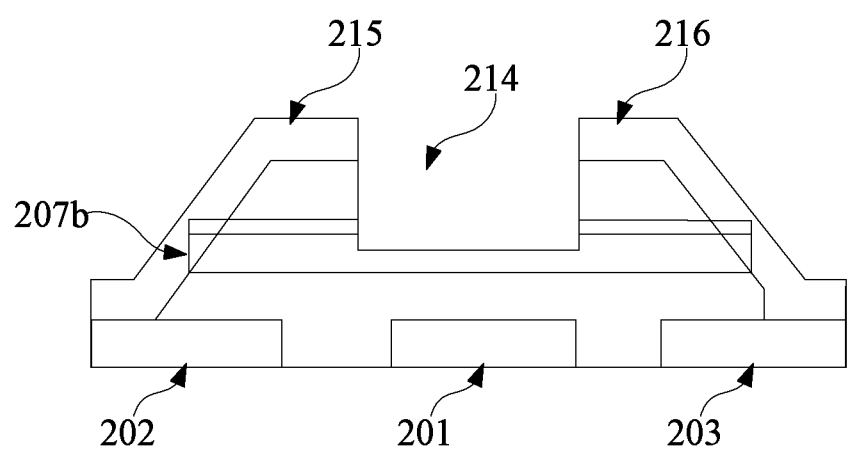
FIG. 9 is a cross sectional view of the array substrate of FIG. 7 along the AA direction in accordance with another embodiment.

Afterward, the dry etching process is applied to the transparent conductive electrode, the passivation layer 207d, and the ohmic contact layer 207c such that the transparent conductive electrode, the passivation layer 207d, and the ohmic contact layer 207c respectively corresponding to the second pole and the third pole are disconnected, as shown in FIGS. 7 and 8. In other embodiment, the top portion above the active layer 207b of the disconnected area 214 may be etched to be disconnected, as shown in FIG. 9.

It can be understood that, the patterns of the disconnected area 214 have not been defined during the photo lithography process. After obtaining the above conductive structure by the wet etching process, a second photo lithography is performed to obtain the disconnected area 214. At this moment, the dry etching process is performed to obtain the disconnected area 214.

Alternatively, the conductive electrode of the second connecting bridge is arranged on the contact ring 209a such that the conductive electrode, the contact ring 209a, the second pole 202, and the third pole 203 are electrically connected. Specifically, the portion of the conductive electrode on the second connecting bridge corresponding to the second pole 202 is a first conductive electrode 215. The first conductive electrode 215 connects to the active layer and the second pole 202 by covering the contact ring at a lateral surface of the second connecting bridge so as to form a loop.

The portion of the conductive electrode on the second connecting bridge corresponding to the third pole 203 is a second conductive electrode 216. The second conductive electrode 216 connects to the active layer and the third pole 203 by covering the contact ring at a lateral surface of the second connecting bridge so as to form a loop. The first conductive electrode 215 and the second signal line 205 are electrically contacted to ensure the electrical connection between the second signal line 205 and the second pole 202 of the TFT. The second conductive electrode 216 and the pixel electrode 211 are electrically contacted to ensure the electrical connection between the pixel electrode 211 and the third pole 203 of the TFT.

In the embodiment, the connecting line 212 is longer than the first connecting bridge 208, and the connecting line 212 is narrower than the first connecting bridge 208 to ensure that the connecting line 212 and the second signal line 205 are isolated from each other, and to ensure that the connecting line 212 electrically connects to the first portion 204a and the second portion 204b. In an example, the connecting line passes through a through hole of the first connecting bridge 208 to electrically connect to the first portion 204a and the second portion 204b. At this moment, the length of the connecting line 212 is not greater than that of the first connecting bridge 208. The storage capacitance electrode 213 and the corresponding first portion 204a form a storage capacitance via the capacitance isolation structure 210.

In one embodiment, the first pole, the second pole, and the third pole correspond to the gate, the source, and the drain of the TFT. The first signal line is a scanning line, and the second signal line is a data line. In other embodiment, the second pole and the third pole correspond to the drain and the source. Alternatively, the first signal line is the data line, and the second signal line is the scanning line. Correspondingly, the first pole is the source or the drain, and the second pole is the gate.

The first mask, the second mask, and the third mask may be general masks or may be half-tone mask.

FIG. 7 is a second top view showing the array substrate obtained by the step S13 in FIG. 1. FIG. 8 is a cross sectional view of the array substrate of FIG. 7 along the AA direction in accordance with one embodiment. The array substrate includes:

a substrate 206;

a first pole 201, a second pole 202, a third pole 203 of at least one TFT on the substrate 206, and a first signal line 204 and a second signal line 205, wherein the first signal line 204 includes a first portion 204a and a second portion 204b at two lateral sides of the second signal line 205;

a first connecting bridge 208 between the first portion 204a and the second portion 204b;

at least one pixel electrode 211 and a connecting line 212 on the first connecting bridge 208, and the connecting line 212 is configured for electrically connect the first portion 204a and the second portion 204b.

The substrate may be a glass substrate or a substrate made by other transparent insulation material. The conductive layer may be a metal layer, or may be non-metal materials that are conductive. The conductive electrode may be a transparent conductive electrode, such as ITO.

Preferably, the width of the first connecting bridge 208 is greater than that of the covered first portion 204a and the covered second portion 204b. In addition, the connecting line 212 is longer than the first connecting bridge 208, and is narrower than the first connecting bridge 208. In an example, the connecting line passes through a through hole of the first connecting bridge 208 to electrically connect to the first portion 204a and the second portion 204b. At this moment, the length of the connecting line 212 is not greater than that of the first connecting bridge 208.

Preferably, the first connecting bridge 208 includes the insulation layer 207a, the active layer 207b, the ohmic contact layer 207c, and the passivation layer 207d arranged in sequence from one side close to the substrate 206, and the details regarding the four layers may be referred to the above disclosure.

Preferably, the first portion 204a of the first signal line electrically connects to the first pole 201 of the TFT, and the second signal line 205 electrically connect to the second pole 202 of the TFT.

The array substrate further includes a second connecting bridge 209 between the second pole 202 and the third pole 203, and a first conductive electrode 215 and the second conductive electrode 216 on the second connecting bridge 209, wherein the second connecting bridge 209 includes the insulation layer 207a, the active layer 207b, the ohmic contact layer 207c, and the passivation layer 207d. The passivation layer 207d and the ohmic contact layer 207c of the second connecting bridge 209 are disconnected by the disconnected area 214. The top portion of the active layer 207b may be disconnected by the disconnected area 214, as shown in FIG. 9.

The first conductive electrode 215 electrically connects the second pole 202 and the active layer 207b, and electrically connects to the second signal line 205. The conductive electrode electrically connects to the third pole 203 and the active layer 207b, and electrically connect to the pixel electrode 211.

Edges of the active layer 207b and the ohmic contact layer 207c of the second connecting bridge 209 protrusive with respect to the insulation layer 207a and the passivation layer 207d to form the contact ring 209a. The first conductive electrode 215 and the second conductive electrode 216 covers the contact ring 209a to electrically connect to the active layer.

Preferably, the array substrate further includes a storage capacitance electrode 213 and the capacitance isolation structure 210 arranged between the storage capacitance electrode 213 and the first signal line 204. Specifically, the capacitance isolation structure 210 includes the insulation layer 207a, the active layer 207b, the ohmic contact layer 207c, and the passivation layer 207d.

In the embodiment, the first signal line 204 intersects with the second signal line 205. The first pole, the second pole, and the third pole correspond to the gate, the source, and the drain of the TFT. The first signal line is the scanning line, and the second signal line is the data line. In other embodiments, the second pole and the third pole may correspond to the drain and the source. Alternatively, the first signal line is the data line, and the second signal line is the scanning line. Correspondingly, the first pole is the source or the drain, and the second pole is the gate.

The present disclosure also discloses an array substrate manufactured by the above manufacturing method.

The array substrate may be the array substrate in LCDs.

The present disclosure also relates to a display panel having an array substrate, a color film substrate, and liquid crystals between the two substrates.

In view of the above, the first signal line of the array substrate includes two sections respectively arranged at two sides of the second signal line. Afterward, the connecting line connecting to the first signal line is formed in the subsequent mask process. In this way, the first signal line may be normally arranged, and the first signal line and the second signal line may be formed by one mask process, and thus two separate mask processes are not needed. Thus, the number of the mask process may be reduced so as to save the manufacturing time and cost.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of array substrates, comprising:

depositing a conductive layer on a substrate, and forming three poles of at least one thin film transistor (TFT), a first signal line, and a second signal line by etching the conductive layer via a first mask, wherein the first signal line comprises a first portion and a second portion respectively at two sides of the second signal line;

depositing an intermediate layer in sequence, and forming a first connecting bridge connecting the first portion and the second portion by etching the intermediate layer via a second mask; and depositing a conductive electrode, and forming at least one pixel electrode and a connecting line between the first portion and the second portion by etching the conductive electrode via a third mask.

2. The manufacturing method as claimed in claim 1, wherein the first portion of the first signal line electrically connects to a first pole of the TFT, the second signal line electrically connects to a second pole of the TFT, and the intermediate layer comprises an insulation layer, an active layer, an ohmic contact layer, and a passivation layer stacked in sequence;

the step of forming a first connecting bridge connecting the first portion and the second portion by etching the intermediate layer via a second mask further comprises forming a second connecting bridge connecting the second pole and a third pole of the TFT by etching the intermediate layer via the second mask;

the step of forming at least one pixel electrode and a connecting line between the first portion and the second portion by etching the conductive electrode via a third mask further comprises disconnecting the conductive electrode, the passivation layer, and the second pole and the third pole corresponding to the ohmic contact layer by etching the second connecting bridge via the third mask.

3. The manufacturing method as claimed in claim 2, wherein the step of forming the second connecting bridge connecting the second pole and the third pole of the TFT by etching the intermediate layer via the second mask further comprises:

adopting HF to etch edges of the passivation layer and the insulation layer of the second connecting bridge such that the active layer and the ohmic contact layer of the second connecting bridge protrude outward to form at least one contact ring.

4. The manufacturing method as claimed in claim 3, wherein the conductive electrode on the second connecting bridge is arranged on the contact ring such that the conductive electrode electrically connects to the contact ring, the second pole, and the third pole.

5. The manufacturing method as claimed in claim 4, wherein the first pole, the second pole, and the third pole of the TFT are respectively a gate, a source, and a drain, and the first signal line is a data line, and the second signal line is a signal line.

6. The manufacturing method as claimed in claim 1, wherein the step of forming the first connecting bridge connecting the first portion and the second portion by etching the intermediate layer via a second mask further comprises forming a capacitance isolation structure on the first portion by etching the intermediate layer via the second mask;

the step of forming at least one pixel electrode and a connecting line between the first portion and the second portion by etching the conductive electrode via the third mask further comprises forming a storage capacitance electrode on the capacitance isolation structure by etching the conductive electrode via the third mask.

7. The manufacturing method as claimed in claim 1, wherein the first pole, the second pole, and the third pole of the TFT are respectively a gate, a source, and a drain, and the first signal line is a signal line, and the second signal line is a data line.

8. An array substrate manufactured by a manufacturing method, and the method comprising:

depositing a conductive layer on a substrate, and forming three poles of at least one thin film transistor (TFT), a first signal line, and a second signal line by etching the conductive layer via a first mask, wherein the first signal line comprises a first portion and a second portion respectively at two sides of the second signal line;

depositing an intermediate layer in sequence, and forming a first connecting bridge connecting the first portion and the second portion by etching the intermediate layer via a second mask; and depositing a conductive electrode, and forming at least one pixel electrode and a connecting line between the first portion and the second portion by etching the conductive electrode via a third mask.

9. The array substrate as claimed in claim 8, wherein the first portion of the first signal line electrically connects to a first pole of the TFT, the second signal line electrically connects to a second pole of the TFT, and the intermediate layer comprises an insulation layer, an active layer, an ohmic contact layer, and a passivation layer stacked in sequence;

the step of forming a first connecting bridge connecting the first portion and the second portion by etching the intermediate layer via a second mask further comprises forming a second connecting bridge connecting the second pole and a third pole of the TFT by etching the intermediate layer via the second mask;

the step of forming at least one pixel electrode and a connecting line between the first portion and the second portion by etching the conductive electrode via a third mask further comprises disconnecting the conductive electrode, the passivation layer, and the second pole and the third pole corresponding to the ohmic contact layer by etching the second connecting bridge via the third mask.

10. The array substrate as claimed in claim 9, wherein the step of forming the second connecting bridge connecting the second pole and the third pole of the TFT by etching the intermediate layer via the second mask further comprises:

adopting HF to etch edges of the passivation layer and the insulation layer of the second connecting bridge such that the active layer and the ohmic contact layer of the second connecting bridge protrude outward to form at least one contact ring.

11. The array substrate as claimed in claim 10, wherein the conductive electrode on the second connecting bridge is arranged on the contact ring such that the conductive electrode electrically connects to the contact ring, the second pole, and the third pole.

12. The array substrate as claimed in claim 8, wherein the step of forming the first connecting bridge connecting the first portion and the second portion by etching the intermediate layer via a second mask further comprises forming a capacitance isolation structure on the first portion by etching the intermediate layer via the second mask;

the step of forming at least one pixel electrode and a connecting line between the first portion and the second portion by etching the conductive electrode via the third mask further comprises forming a storage capacitance electrode on the capacitance isolation structure by etching the conductive electrode via the third mask.

13. The array substrate as claimed in claim 8, wherein the first pole, the second pole, and the third pole of the TFT are respectively a gate, a source, and a drain, and the first signal line is a signal line, and the second signal line is a data line.

\* \* \* \* \*